April 11, 1961 W. SHOCKLEY 2,979,427

SEMICONDUCTOR DEVICE AND METHOD OF MAKING THE SAME

Filed March 18, 1957

WILLIAM SHOCKLEY
INVENTOR.

BY Flehr & Swain
ATTORNEYS

United States Patent Office 2,979,427
Patented Apr. 11, 1961

2,979,427

SEMICONDUCTOR DEVICE AND METHOD OF MAKING THE SAME

William Shockley, 23466 Corta Via, Los Altos, Calif.

Filed Mar. 18, 1957, Ser. No. 646,625
17 Claims. (Cl. 148—1.5)

This invention relates generally to a semiconductor device and method of making the same, and more particularly to a semiconductor device involving the diffusion of impurity atoms along grain boundaries to form a semiconductor device.

It is a general object of the present invention to provide an improved semiconductor device and method of making the same which includes operating regions formed along grain boundaries.

It is another object of the present invention to provide a semiconductor device and method of making the same in which relatively small structures are provided in the interior of a block of nearly intrinsic material.

It is another object of the present invention to provide a semiconductor device and method of making the same which is suitable for relatively high frequency operation.

It is another object of the present invention to provide a semiconductor device and method of making the same in which diffusion of impurity atoms along grain boundaries is employed to form junction field effect and analog transistors as desired.

It is a further object of the present invention to provide a semiconductor device and method of making the same in which the control of the diffusion of impurity atoms along grain boundaries is employed to form a novel structure.

These and other objects of the invention will become more clearly apparent from the following description when read in conjunction with the accompanying drawing.

Referring to the drawing:

Figures 1A–C show the steps in forming a novel semiconductor device in accordance with the invention;

Figure 1:
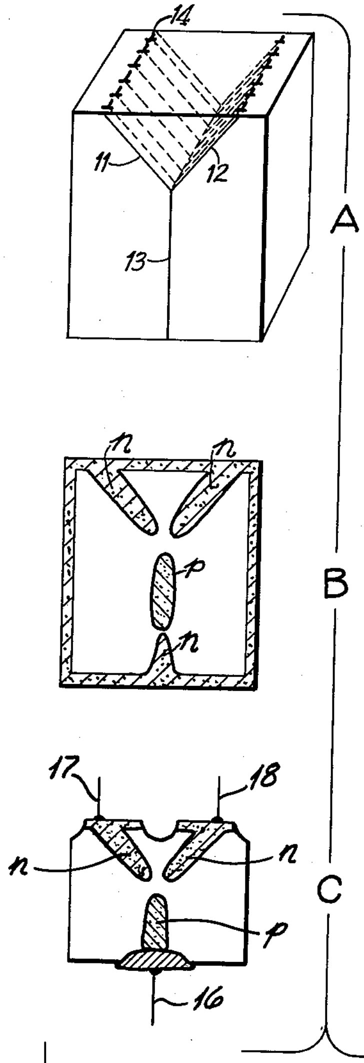

Diffusion takes place in crystals more readily along grain boundaries than it does through the bulk of the crystal. This is considered due to the misfit between atoms on a grain boundary. The looseness in the packing or fitting together of the atoms at the grain boundary results in more room for atoms to move by one another. Consequently, atoms diffuse more readily along grain boundaries.

It has also been observed that diffusion in grain boundaries has a preferred direction. In general, the preferential diffusion in a tilted twin boundary is along edge dislocations. In large angle grain boundaries, the diffusion is substantially uniform in all directions.

Referring to Figure 1A, a crystal of nearly intrinsic material including three grain boundaries 11, 12 and 13 is shown. These are in the form of an elongated Y with the leg of the Y substantially longer than the arms. The structure shown may be grown by seeding the crystal whereby the boundaries 11 and 12 are twin boundaries to which has been added a small angle of tilt to give edge dislocations 14. Where the planes of the edge dislocations 11 and 12 meet, a new boundary 13 is formed. The boundary 13 is a large angle grain boundary. The grown crystal is cut to form the crystal illustrated in which the edge dislocations extend to the surface.

As previously described, the diffusion in the boundaries 11 and 12 will have a preferential direction in the direction of the edge dislocations while the diffusion in the region 13 will proceed rapidly and, in general, in all directions.

The structure shown in Figure 1A can be used to form analog, field effect, and junction transistors as will become presently apparent.

By choosing the dimensions of the grain boundaries along the planes 11, 12 and 13, the concentration of impurity atoms and the diffusion time, the diffusion along the grain boundaries 11, 12 and 13 will dominate. The diffusion may be regarded as essentially one-dimensional in the structure along the grain boundaries.

Referring for a moment to the curve, which is a plot of concentration of donors and acceptors as a function of distance into the material for a two step diffusion process, i.e., first a diffusion of acceptors inward for a given period of time, then a subsequent diffusion of donors for a given period of time while the acceptors at the surface are allowed to leave. It is seen that at a distance $X_1$ the material is compensated. At distances less than the distance of $X_1$, the donors will predominate, while at distances greater than $X_1$, the acceptors will predominate. As a result, at shallow depths the diffusion process produces n-type material, while at the deeper depths it produces p-type material.

A novel analog transistor may be formed by choosing the dimensions of Figure 1 whereby the planes 11 and 12 intersect at a distance corresponding generally to $X_1$. The plane 13 is of a length greater than the distance $X_1$ whereby the material near the junction of the three grain boundaries will be p-type.

Figure 2:
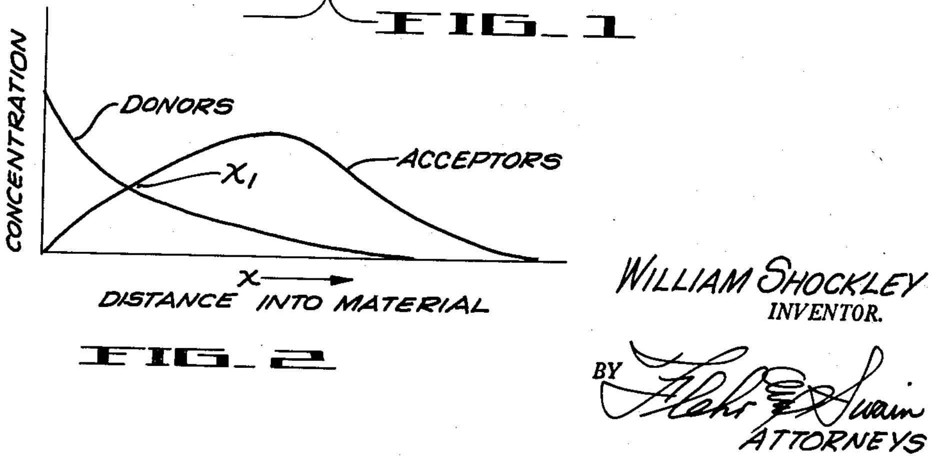
Figure 2 is a plot of concentration of donors and acceptors as a function of distance along a grain boundary.

To form the novel analog transistor, the crystal, Figure 1A, is subjected to a first diffusion of acceptors for a predetermined time whereby the acceptors diffuse inward. Subsequently, the crystal is subjected to a diffusion in the presence of donors. The donors will diffuse inwardly while the acceptors at the surface leave. At the intersection of the grain boundaries, if the times and distances are properly chosen, the material will be compensated, corresponding to the point $X_1$, Figure 2. In the planes 11 and 12, n-type regions are formed since the distance is less than $X_1$, while in the leg of the Y a p-type region is formed since the distance is greater than $X_1$. The n-type material extends inwardly at the bottom of the leg for a distance corresponding to that on top.

Subsequent to this, material is removed from the exterior of the crystal by etching or the like, as shown in Figure 1C. A suitable alloy contact 16 is made to the p-type region which is formed at the large angle grain boundary. Suitable contacts 17 and 18 are made to the n-type regions at the top. The resulting structure is shown in Figure 1C.

It is seen that the structure resembles an analog transistor in which one of the n-type regions may play the role of a cathode and the other the role of a plate. The p-type region acts as a grid to control the flow of carriers from one n-type region to the other.

Figure 3:
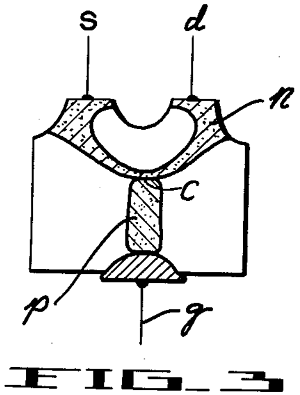
Figure 3 shows another semiconductor device made in accordance with the invention.
Figure 4:
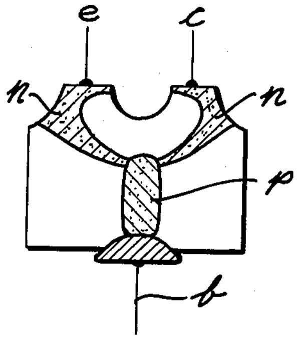
Figure 4 shows still another device made in accordance with the invention.

By controlling the diffusion times and concentrations, the structures of Figures 3 or 4 may be produced. Referring particularly to Figure 3, it is seen that the n-type regions join at the apex of the p-type region. This is a field effect transistor in which the source *s* and drain *d* connections may be made to the two n-type regions and the channel *c* is formed adjacent the p-type gate *g* which forms a gate junction with the channel. The channel may be made extremely short and narrow to permit high frequency operation.

In Figure 4 the p-type region extends up to and separates the two n-type regions and forms junctions therewith. A junction transistor is formed with an n-type emitter *e* and n-type collector *c*, and a base region *p*. Here, the base region may be made relatively short for high frequency operation.

It is, of course, to be understood that the drawings are merely for purposes of illustration and that the various dimensions are exaggerated to more clearly illustrate the invention.

The advantage of the structures shown is that the various regions may be made extremely small. The block of nearly intrinsic material which has a conductivity substantially less than the operating regions serves to support them in spaced relationship. Under operating conditions, the nearly intrinsic material acts substantially as an insulating dielectric layer.

I claim:

1. A semiconductor device comprising a crystal of semiconductor material having three grain boundaries, regions of impurity semiconductive material disposed along said grain boundaries and supported by the crystal, two of said regions being of one conductivity type and the other of said regions being of opposite conductivity type, said regions having a portion in operative relationship with one another, said crystal being substantially less conductive than the impurity material, and ohmic contacts formed to said regions.

2. A semiconductor device comprising a crystal of semiconductor material having three grain boundaries disposed substantially in the form of a Y, regions of impurity semiconductive material disposed along said grain boundaries and converging towards the center of the Y, the regions along the arms of the Y being of one conductivity type and the region along the leg of the Y being of opposite conductivity type.

3. A device as in claim 2 wherein said regions are separated from one another at the center of the Y to form an analog transistor.

4. A device as in claim 2 wherein the impurity semiconductor regions in the arms of the Y form a continuous path through the crystal and the impurity semiconductor regions in the leg forms a junction therewith.

5. Apparatus as in claim 2 wherein said semiconductor region in the leg of said Y extends upwardly to form a junction with each of the regions along the arms of the Y.

6. A semiconductor device comprising a body of semiconductor material supporting two regions of relatively heavily doped semiconductive material of one conductivity type, and a third region of relatively heavily doped material of opposite conductivity type, said regions approaching a common line with the distance of approach much less than the distance between the surface and the line, said body of semiconductor material being substantially less conductive than the said regions, and ohmic contact formed with each of said regions.

7. A device as in claim 6 wherein said two regions join to form a continuous region and said third region forms a junction therewith.

8. A device as in claim 6 wherein said third region forms a junction with each of said two regions.

9. The method of forming a semiconductor device which comprises the steps of forming a crystal having three converging grain boundaries, one of said boundaries being deeper than the other two, subjecting the crystal to a first diffusion of impurity atoms of one type whereby the atoms diffuse inwardly along each of the grain boundaries, subsequently subjecting the crystal to a second diffusion in the presence of impurity atoms of opposite type whereby the atoms of opposite type diffuse inwardly and compensate the impurity semiconductive material in the shallow regions but do not fully compensate the impurity concentration in the deep region.

10. The method as in claim 9 wherein the first and second diffusions are controlled whereby the impurity semiconductor material along the shallow pair of grain boundaries joins to form a continuous region through the crystal and impurity material along the deep grain boundary forms a junction therewith.

11. The method as in claim 9 wherein first and second diffusions are controlled whereby one of the impurity regions in the deep boundary forms a junction with each of the impurity regions in the shallow boundary.

12. The method of forming a semiconductor device which comprises forming three grain boundaries in the form of a Y in an intrinsic semiconductor, the grain boundaries along the arms of said Y having edge dislocations extending to the surface and the grain boundary along the leg being a large angle grain boundary, and subjecting the crystal to first and second diffusions in the presence of opposite types of impurity atoms whereby regions of the same conductivity type are formed along the arms of the Y, and a region of opposite conductivity type is formed along the leg of the Y.

13. A semiconductor device comprising a crystal of substantially intrinsic semiconductive material having a plurality of grain boundaries, at least one diffusion region of impurity semiconductive material formed along each of said grain boundaries and in cooperative relationship to one another, said crystal of intrinsic semiconductive material serving to support the diffusion regions of impurity material and means for making electrical contact to each of said diffusion regions.

14. A semiconductor device comprising a crystal of substantially intrinsic semiconductive material having three grain boundaries, diffusion regions of semiconductive material having impurity concentration disposed along said grain boundaries and supported by the crystal, two of said regions being of one conductivity type and the other of said regions being of opposite conductivity type, a portion of said regions being disposed whereby they cooperate to form an operating device, and ohmic contacts formed to each of said regions.

15. A semiconductor device comprising a crystal of semiconductive material having three grain boundaries disposed substantially in the form of a Y, diffusion regions of impurity semiconductive material disposed along said grain boundaries and converging towards the center of the Y, regions along the arms of the Y being of one conductivity type, and the regions along the leg of the Y being of opposite conductivity type.

16. A semiconductor device comprising a crystal of semiconductive material having three grain boundaries, diffusion regions of semiconductive material disposed along said grain boundaries and supported by the crystal, two of said regions being of one conductivity type and joining to form a continuous region, and the other of said regions being of the opposite conductivity type and forming a junction with said two regions, a portion of said regions being disposed whereby they cooperate to form a junction therewith, and ohmic contacts formed to each of said regions.

17. A semiconductor device comprising a crystal of semiconductive material having three grain boundaries, diffusion regions of semiconductive material disposed along said grain boundaries and supported by the crystal, two of said regions being of one conductivity type and the other of said regions being of opposite conductivity type, said other region forming a junction with each of said two regions, and ohmic contact formed to each of said regions.

References Cited in the file of this patent

UNITED STATES PATENTS

| | | |
|---|---|---|
| 2,654,059 | Shockley | Sept. 29, 1953 |
| 2,701,326 | Pfann et al. | Feb. 1, 1955 |
| 2,779,877 | Lehovec | Jan. 29, 1957 |
| 2,795,742 | Pfann | June 11, 1957 |

OTHER REFERENCES

Metallurgical Abstracts, vol. 21, 1953–54, pages 238 and 444, published by the "Institute of Metals."